(12) United States Patent
Huang et al.

(10) Patent No.: US 10,859,326 B2
(45) Date of Patent: Dec. 8, 2020

(54) FIN STACK FOR PROCESSOR COOLING

(71) Applicant: Dell Products L.P., Round Rock, TX (US)

(72) Inventors: Ting-Chiang Huang, New Taipei (TW); Tse-An Chu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/243,678

(22) Filed: Jan. 9, 2019

(65) Prior Publication Data
US 2020/0217598 A1   Jul. 9, 2020

(51) Int. Cl.
| | |
|---|---|
| B23P 15/26 | (2006.01) |
| F28F 3/00 | (2006.01) |
| F28F 3/02 | (2006.01) |
| F28F 21/00 | (2006.01) |
| F28F 21/08 | (2006.01) |
| G06F 1/18 | (2006.01) |
| G06F 1/20 | (2006.01) |
| H01L 21/02 | (2006.01) |
| H01L 21/48 | (2006.01) |
| H01L 23/34 | (2006.01) |
| H01L 23/367 | (2006.01) |
| F28F 3/08 | (2006.01) |
| H01L 23/467 | (2006.01) |

(52) U.S. Cl.
CPC .............. *F28F 3/08* (2013.01); *F28F 21/084* (2013.01); *F28F 21/085* (2013.01); *G06F 1/203* (2013.01); *H01L 21/4871* (2013.01); *H01L 23/467* (2013.01); *F28F 2215/04* (2013.01); *F28F 2275/06* (2013.01); *G06F 2200/201* (2013.01)

(58) Field of Classification Search
CPC ..... B23P 15/26; F28F 3/00; F28F 3/02; F28F 21/00; F28F 21/08; G06F 1/18; G06F 1/20; H01L 21/02; H01L 21/48; H01L 23/34; H01L 23/367
USPC ........ 361/679.46, 697, 709; 29/832, 890.03; 438/118, 122; 165/80.3, 185; 257/E23.102, E23.103, E23.105, 718, 722
See application file for complete search history.

(56) References Cited

U.S. PATENT DOCUMENTS

| | | | | |
|---|---|---|---|---|
| 5,654,587 A | * | 8/1997 | Schneider | ................. F28F 3/02 165/80.3 |
| 5,773,886 A | * | 6/1998 | Rostoker | ................... F28F 3/02 165/80.3 |
| 5,937,517 A | * | 8/1999 | Smith | ..................... B23P 15/26 257/E23.102 |
| 5,963,795 A | * | 10/1999 | Schneider | ........... H01L 21/4882 257/E23.103 |
| 6,009,938 A | * | 1/2000 | Smith | ................. H01L 21/4882 165/185 |
| 6,301,779 B1 | * | 10/2001 | Azar | ...................... B23P 15/26 165/80.3 |

(Continued)

*Primary Examiner* — Xiaoliang Chen
(74) *Attorney, Agent, or Firm* — Norton Rose Fulbright US LLP

(57) ABSTRACT

A heatsink may include multiple fin portions soldered together. The fin portions may have stair-stepped surfaces that provide improved thermal dissipation over conventional singular block heatsinks. The portions may be made of different materials, which can allow the heatsink to be made of materials that can be manufactured thinner. The thinner fins can further improve thermal dissipation performance.

20 Claims, 5 Drawing Sheets

(56) References Cited

U.S. PATENT DOCUMENTS

| | | | | |
|---|---|---|---|---|
| 6,422,307 | B1* | 7/2002 | Bhatti | F28F 3/02 |
| | | | | 165/185 |
| 2004/0220434 | A1* | 11/2004 | Brophy | B01J 19/0093 |
| | | | | 568/959 |
| 2007/0039332 | A1* | 2/2007 | Lee | H04B 1/036 |
| | | | | 62/3.2 |
| 2009/0025222 | A1* | 1/2009 | Miyahara | B21J 5/12 |
| | | | | 29/890.03 |
| 2011/0298352 | A1* | 12/2011 | Velu | F21V 29/74 |
| | | | | 313/46 |
| 2012/0033381 | A1* | 2/2012 | Matsumoto | H05K 7/20145 |
| | | | | 361/697 |
| 2012/0261106 | A1* | 10/2012 | Kelly | F28F 3/022 |
| | | | | 165/185 |
| 2015/0198372 | A1* | 7/2015 | Desikan | F28D 1/0366 |
| | | | | 165/151 |
| 2015/0289416 | A1* | 10/2015 | Kim | H05K 7/20418 |
| | | | | 361/709 |
| 2016/0091193 | A1* | 3/2016 | Cai | F21K 9/232 |
| | | | | 362/235 |
| 2018/0301269 | A1* | 10/2018 | Sundaram | H01F 27/22 |
| 2018/0348826 | A1* | 12/2018 | Aguirre | F04D 29/4226 |
| 2018/0351070 | A1* | 12/2018 | Suzuki | H01L 35/30 |

* cited by examiner

FIN STACK FOR PROCESSOR COOLING

FIELD OF THE DISCLOSURE

The instant disclosure relates to information handling systems. More specifically, portions of this disclosure relate to cooling for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include hardware components that generate heat when operated. For example, information handling systems include central processing units (CPUs) and graphics processing units (GPUs) that can generate significant heat when operating at full load. The heat must be removed from the vicinity of the hardware components to keep the components from overheating and to allow the components to continue operating at high performance. The problem of removing heat generated by the hardware components is complicated by the form factor of the information handling system. Systems are getting thinner and lighter with less space for cooling systems, while demand is for higher performance components that have higher power consumption.

An example of a conventional heatsink is shown in FIG. 1A and FIG. 1B. FIG. 1A is a two-dimensional representation of a heatsink according to the prior art. FIG. 1B is a cross-sectional view of a heatsink according to the prior art. A heatsink 110 may include a plurality of fins that channel heat away from a source, such as a processor. The fins transport heat away from the source and provide a path for airflow through the fins. Air passing through the fins conduct heat away from the fins and transport heat away from the heatsink 110.

SUMMARY

Embodiments of the disclosure provide a heatsink for a cooling system with improved heat dissipation. The embodiments include two or more fin portions that are thermally coupled together to form the heatsink. Using two fin portions allow a mixing of materials and fin configurations within a single heatsink. Mixing of different characteristics for the different fin portions allows the benefits of multiple materials to be obtained while reducing the effect of undesirable qualities of certain materials. Furthermore, a stair-step design of the fin portions increases thermal dissipation area further improving thermal performance. The embodiments can enhance the thermal module capability within existing form factors of information handling system and allow smaller form factors while maintaining thermal performance. Further, some embodiments may provide an additional benefit of reducing thermal module weight and cost. Some embodiments of a new fin geometry for the heatsink may allow an increase of the existing heat exchange area within a heatsink and also allow use of fin designs that enhance fin strength. The fin strength enhancement is made possible by the soldering, or otherwise attaching, two fin portions together. With the two fin portions attached together, higher strength and/or diverse materials may be used (such as materials with different thermal conductance) in the fin portions. These higher strength materials allow reducing the fin size to 0.1 mm or smaller.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 2A:
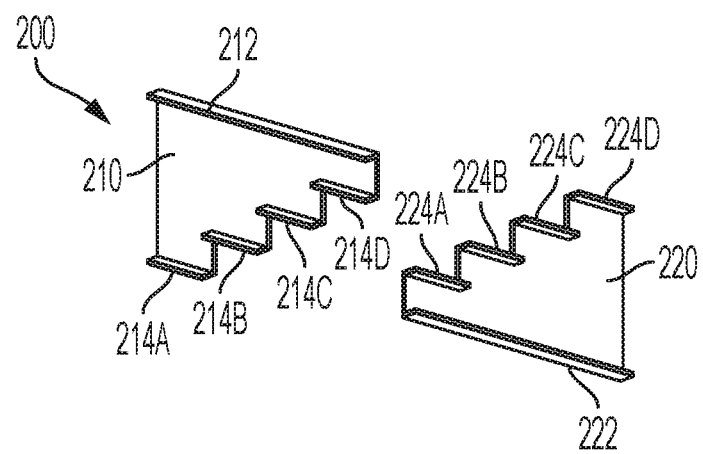
FIG. 2A is a two-dimensional representation of a heatsink according to some embodiments of the disclosure.

FIG. 2A is a two-dimensional representation of a heatsink according to some embodiments of the disclosure for use in information handling system. A heatsink 200 may include two fin portions 210 and 220 with fins organized into a stair-step fashion. A first fin portion 210 may include a first surface 212 on one side of the portion 210. An opposite side of the portion 210 may include a number of stair stepped surfaces at different distances from the first surface 212. For example, a second surface 214A, a third surface 214B, and additional surfaces 214C-D are located at stepped intervals from the first surface 212. The steps between the surfaces 214A-D may be equal or may be different. A second fin portion 220 may be configured with stair steps that correspond to the steps of the first fin portion 210, such that the fin portions 210 and 220 may fit together. The second fin portion 220 may include a fourth surface 222 on one side of the portion 220. An opposite side of the portion 220 may include a number of stair stepped surfaces at different distances from the fourth surface 222. For example, a fifth surface 224A, a sixth surface 224B, and additional surfaces 224C-D are located at stepped intervals from the fourth surface 222. The steps between the surfaces 224A-D may be equal or may be different. The stair steps 214A-D of the second fin portion 220 may be oppositely oriented from the stair steps 224A-D of the first fin portion 210 such that the two portions 210 and 220 fit together to form a rectangular shape. For example, whereas the distance between the second surface 214A from the first surface 212 is larger than the distance between the third surface 214B from the first surface 212, the distance between the fifth surface 224A from the fourth surface 222 is smaller than the distance between the sixth surface 224B from the fourth surface 222.

Figure 2B:
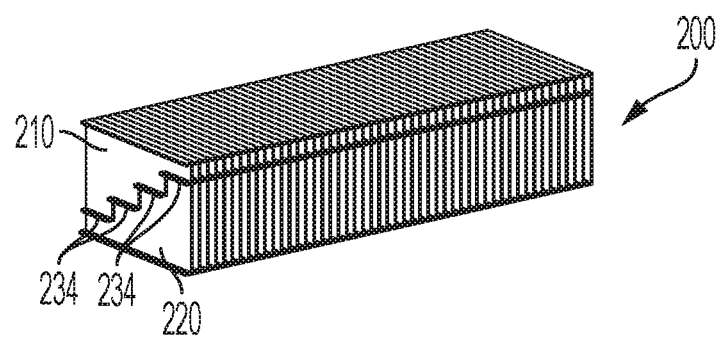
FIG. 2B is an illustration of a heatsink formed from a first fin portion and a second fin portion according to some embodiments of the disclosure.

When the two fin portions 210 and 220 are fit together a heatsink structure is formed as shown in FIG. 2B. FIG. 2B is an illustration of a heatsink formed from a first fin portion and a second fin portion according to some embodiments of the disclosure. The heatsink includes the fin portions 210 and 220 attached together at steps 234. The portions 210 and 220 are thermally coupled such that heat can transfer from the fin portion 210 to the fin portion 220 and vice versa. In some embodiments, the fin portions 210 and 220 are physically coupled, such as through soldering of the materials, such that the fifth surface 224A is in contact with the second surface 214A, and likewise for other surfaces. In some embodiments, the fin portions 210 and 220 are chemically coupled, such as through a glue or thermally-conductive adhesive. In some embodiments, the fin portions 210 and 220 may be in contact with each other through a compressing force that presses the fin portion 210 into the fin portion 220. For example, screws may be used to force the fin portion 220 into contact with fin portion 210. As another example, a clamp may be used to force the fin portion 220 into contact with fin portion 210.

Figure 1A:
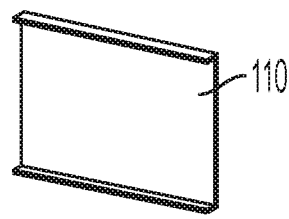
FIG. 1A is a two-dimensional representation of a heatsink according to the prior art.
Figure 1B:
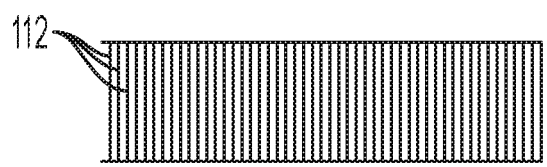
FIG. 1B is a cross-sectional view of a heatsink according to the prior art.
Figure 2C:
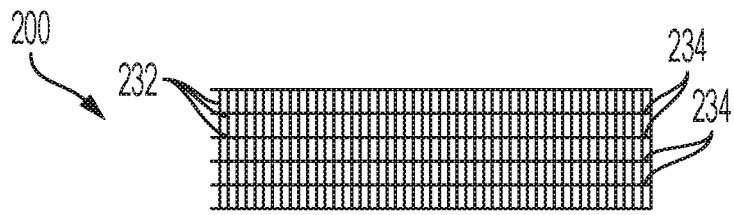
FIG. 2C is a cross-sectional view of a heatsink according to some embodiments of the disclosure.

The stair-step structure shown in FIG. 2A and FIG. 2B, provides thermal conduction along a different vector than the individual fins of the conventional design shown in FIG. 1B. The thermal conduction vectors in the stair-step structure are shown in FIG. 2C. FIG. 2C is a cross-sectional view of a heatsink according to some embodiments of the disclosure. The heatsink 200 may include heat transfer paths along a vertical dimension 232 from the heat source (e.g., processor) and along a horizontal dimension 234 across the heatsink 200 through the surfaces 214A-D and 224A-d used to couple the fin portions 210 and 220 together.

The use of fin portions 210 and 220 in the heatsink 200 permits the use of different materials for the fin portions 210 and 220. For example, the first fin portion 210 may be a first material, ad the second fin portion 220 may be a different second material. In some embodiments, the first fin portion 210 is copper and the second fin portion 220 is aluminum. In some embodiments, the first fin portion 210 is an alloy material with at least copper and aluminum and the second fin portion 220 is one of copper and aluminum. When different materials are used for the fin portions 210 and 220 the benefits of different materials can be combined. For example, copper and aluminum can be used to obtain improved strength and improved thermal dissipation over using only copper or only aluminum or only a copper-aluminum alloy as used in conventional single fin portion heatsinks. In one embodiment, a material with better thermal conductivity material can be placed on a top side portion of the heatsink.

Figure 2D:
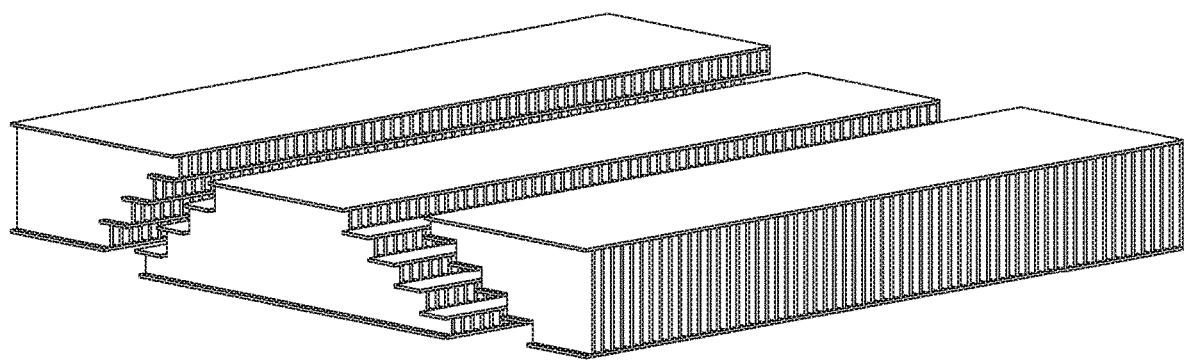
FIG. 2D is an illustration of a heatsink formed with three fin portions according to some embodiments of the disclosure.
Figure 2E:
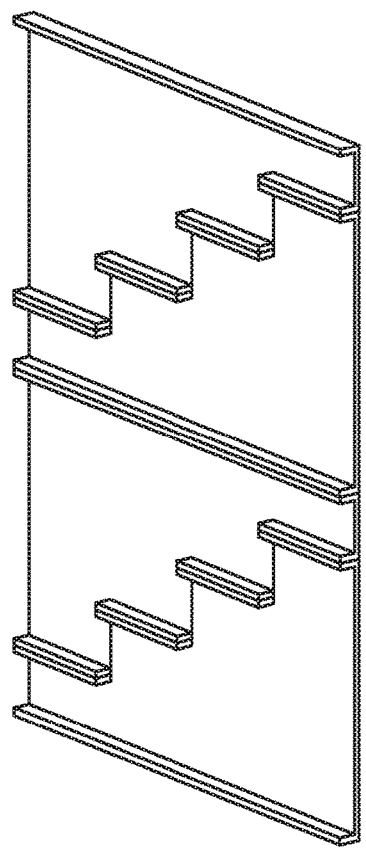
FIG. 2E is an illustration of a heatsink formed with three four fin portions according to some embodiments of the disclosure.

Other properties of the fins in the different fin portions 210 and 220 can also be varied. For example, fin thickness of portion 210 can be different from fin thickness of portion 220. In one embodiment, the portion 210 may have a fin thickness of 0.2 mm and the portion 220 may have a fin thickness of 0.1 mm. The materials and properties of the fins can be matched. For example, when a stronger material is used for portion 210 the fin thickness can be reduced compared to a fin thickness used for a weaker but higher thermal performance material of portion 220. Thus, combining multiple fin portions can provide flexibility in the design of a heatsink to meet form-factor requirements of the information handling system, thermal dissipation requirements of a processor or other hardware component being cooled, and air flow profile for the information handling system. Although embodiments with two fin portions are shown in certain figures, embodiments of the invention can include more than two fin portions. For example three fin portions can be combined by having a triangular stair-step center fin portion with matching end stair-step fin portions as shown in FIG. 2D. As another example, four fin portions can be combined by vertically stacking two fin portions of FIG. 2C as shown in FIG. 2E.

Figure 3A:
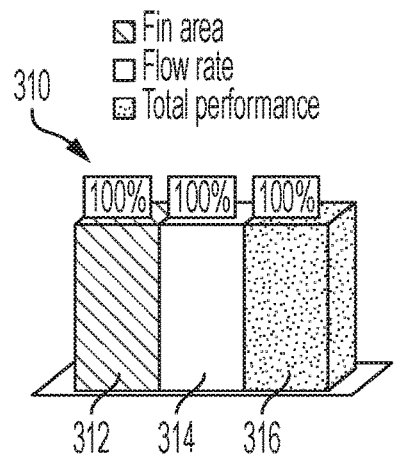
FIG. 3A is a graph illustrating thermal performance of a conventional heatsink in an information handling system.

FIG. 3A is a graph illustrating thermal performance of a conventional heatsink in an information handling system. A graph 310 shows bar 312 for the fin area of a conventional heatsink, bar 314 for the air flow rate through a conventional heatsink, and bar 316 for the cooling performance of a conventional heatsink. Graph 310 shows baseline reference values for comparing aspects of embodiments of the invention shown in FIG. 3B and FIG. 3C.

Figure 3B:
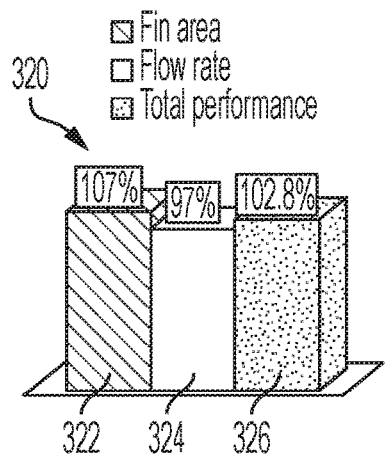
FIG. 3B is a graph illustrating thermal performance of a heatsink with two fin portions with a fin thickness of 0.2 mm according to some embodiments of the disclosure.

FIG. 3B is a graph illustrating thermal performance of a heatsink with two fin portions with a fin thickness of 0.2 mm according to some embodiments of the disclosure. A graph 320 shows bar 322 for the fin area of a heatsink with two fin portions such as shown in FIG. 2B, bar 324 for air flow rate through the heatsink with two fin portions, and bar 326 for the cooling performance of the heatsink with two fin portions. Graph 320 shows the unexpected result that, despite having lower air flow rate through the heatsink due to the additional surfaces for the stair stepping, the thermal performance is increased for the heatsink with two fin portions over the conventional heatsink. Conventionally, a heatsink with a 3% lower air flow rate, such as shown in bar 324, would have a 3% or more lower thermal performance. Instead, the heatsink with two fin portions shows a 3% improvement in thermal performance despite having 3% lower air flow rate. The improved thermal performance may be attributed to the 7% increased fin area of the heatsink with two fin portions over the conventional thermostat as shown in bar 322.

Figure 3C:
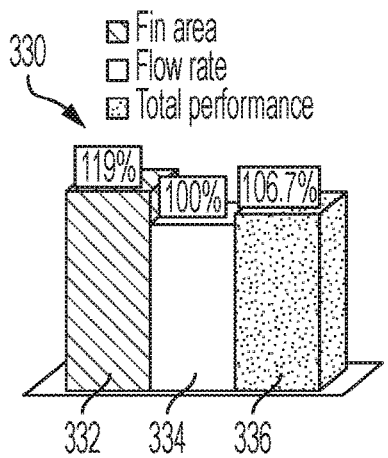
FIG. 3C is a graph illustrating thermal performance of a heatsink with two fin portions with a fin thickness of 0.1 mm according to some embodiments of the disclosure.

The use of the two fin portions can allow the manufacture of thinner fins than used in conventional heat sinks. The smaller fin size may be possible by using different materials for the fin portions or by better manufacturing control over the smaller portions. Thus, the two-fin portion heatsink can be manufactured with smaller fin thicknesses, such as smaller than 0.2 mm and as small or smaller than 0.1 mm. The conventional heatsink performance of FIG. 3A is shown for a thickness of 0.2 mm. The improved performance of the two-fin portion heatsink in FIG. 3B is also shown for a thickness of 0.2 mm. Reducing the fin thickness to 0.1 mm, made possible by embodiments of the disclosure, can further improve thermal performance as shown in FIG. 3C. FIG. 3C is a graph illustrating thermal performance of a heatsink with two fin portions with a fin thickness of 0.1 mm according to some embodiments of the disclosure. A graph 330 includes a bar 332 for fin area of the heatsink with 0.1 mm fins. The thinner thins significantly increases fin area by 19%. The thinner fins also reduces resistance to air flow, allowing the air flow rate shown in bar 334 to be comparable with that of conventional heatsinks. The thermal performance of a heatsink with two fin portions and 0.1 mm fins is improved nearly 7% over the conventional heatsink as shown in bar 336.

Figure 4:
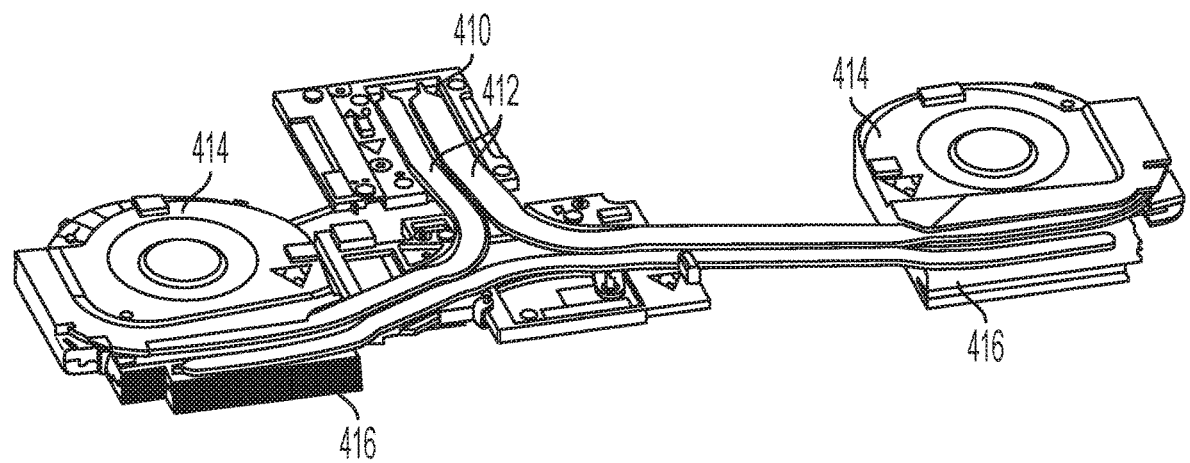
FIG. 4 is a computer-generated rendering illustrating a processor cooling system for a mobile information handling system that includes a heatsink with two fin portions according to some embodiments of the disclosure.

Heatsinks with two fin portions can be used in information handling systems to cool hardware components, such as processors. The heatsinks according to embodiments described here are particularly useful in mobile information handling systems, such as laptop computers, tablet computers, and mobile phones, where the chassis for the information handling system is small and restricts the placement of components within. FIG. 4 is a computer-generated rendering illustrating a processor cooling system for a mobile information handling system that includes a heatsink with two fin portions according to some embodiments of the disclosure. A processor 410 may be thermally coupled to heat pipes 412. Heat pipes 412 may transport heat generated by the processor 410 to heatsinks 416. Fans 414 may push air through the heatsinks 416 to transport heat away from the heatsinks 416 to outside the chassis. The heatsinks 416 may be heatsinks according to embodiments described with two fin portions and/or thin fins.

Figure 5:
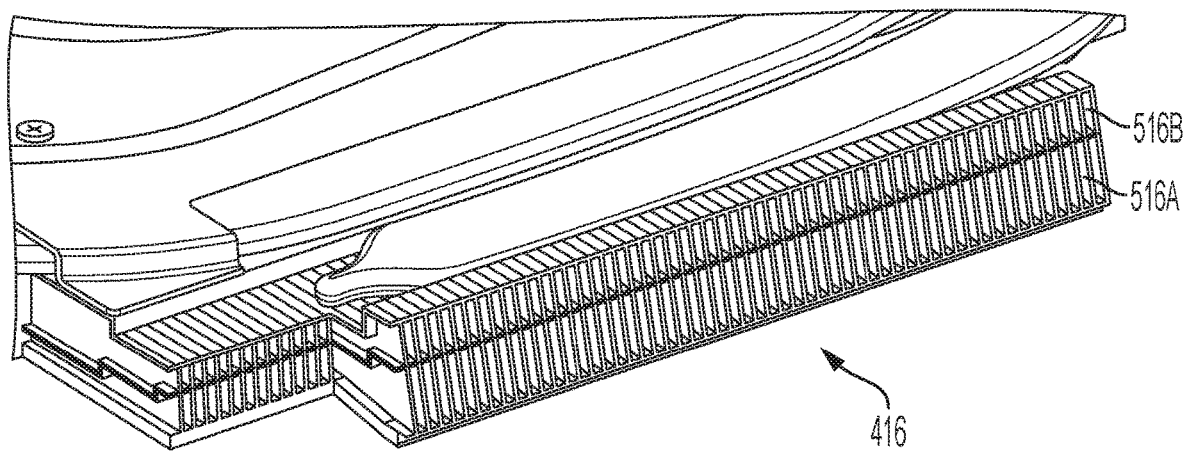
FIG. 5 is a computer-generated rendering illustrating a heatsink with two fin portions according to some embodiments of the disclosure installed in a cooling system for a mobile information handling system.

A heatsink with two fin portions installed in a mobile information handling system is shown in more detail in FIG. 5. FIG. 5 is a computer-generated rendering illustrating a heatsink with two fin portions according to some embodiments of the disclosure installed in a cooling system for a mobile information handling system. The heatsink 416 includes two fin portions 516A and 516B, which may be configured as described with reference to FIG. 2A, FIG. 2B, and FIG. 2C, and other embodiments described herein.

Figure 6:
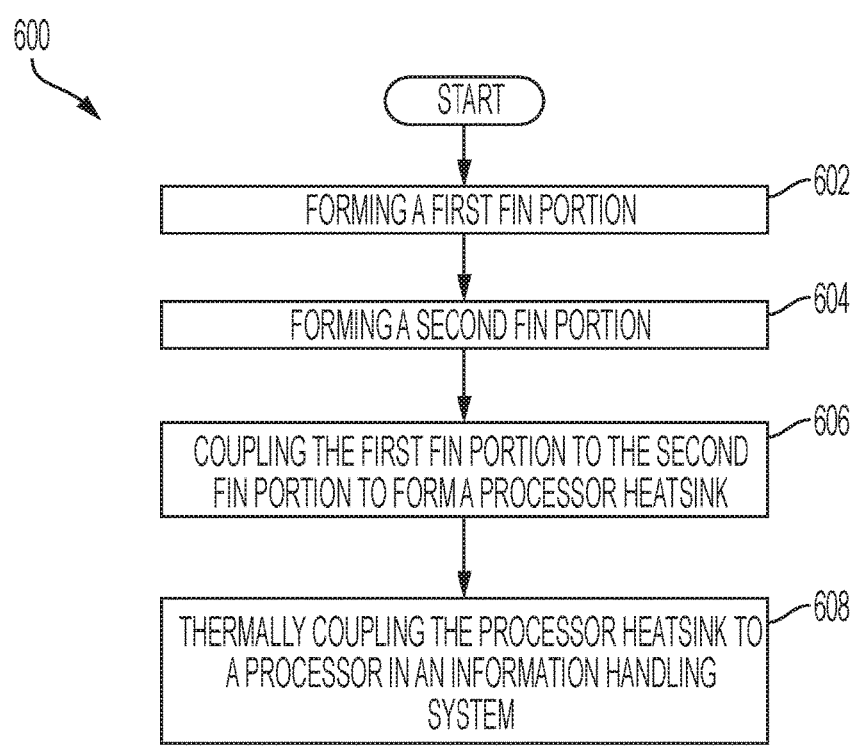
FIG. 6 is a flow chart illustrating a method for manufacturing an information handling system with two fin portions according to embodiments of the disclosure.

The heatsink for the information handling system may be manufactured using the method illustrated in FIG. 6. FIG. 6 is a flow chart illustrating a method for manufacturing an information handling system with two fin portions according to embodiments of the disclosure. A method 600 begins at block 602 with forming a first fin portion with stair-stepped surfaces and at block 604 with forming a second fin portion with stair-stepped surfaces. The two fin portions of blocks 602 and 604 may be made of different materials in some embodiments. At block 606 the first and second fin portions are thermally coupled together to form a processor heatsink. The thermal coupling of the portions may include physically coupling the two portions, such as by soldering the two fin portions together at the stair-stepped surfaces. At block 608, the processor heatsink is thermally coupled to the processor in an information handling system. For example, the heatsink may be placed on top of a processor and then clamped down such that a force applied to the heatsink maintains contact between the processor and the heatsink. As another example, a thermal paste can be placed on the processor and the heatsink on the thermal paste to provide thermal conductivity from the processor to the heatsink.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although cooling for processors in information handling systems are described throughout the detailed description, aspects of the invention may be applied to the design of or implemented on different kinds of processors, such as graphics processing units (GPUs), central processing units (CPUs), and digital signal processors (DSPs), and on different kinds of systems. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

What is claimed is:

1. An apparatus, comprising:
   a first fin portion comprising a first surface, a second surface and a third surface, wherein the second surface and the third surface are on a side of the first fin portion opposite the first surface, and wherein the second surface and the third surface are located different distances from the first surface; and
   a second fin portion comprising a fourth surface, a fifth surface, and a sixth surface, the fourth surface located at one end of the second fin portion and the fifth surface and the sixth surface located at an opposite end of the second fin portion from the fourth surface, wherein the fifth surface and the sixth surface are located different distances from the fourth surface,
   wherein the first fin portion and the second fin portion are coupled together by coupling of the fifth surface with the second surface and by coupling of the sixth surface with the third surface,
   wherein the first fin portion comprises a first material and the second fin portion comprises a different second material, and
   wherein the first fin portion comprises a first plurality of parallel fins coupled to the first surface, the second surface, and the third surface and the second fin portion comprises a second plurality of parallel fins coupled to the fourth surface, the fifth surface, and the sixth surface.

2. The apparatus of claim 1, wherein the first fin portion and the second fin portion are coupled together by soldering of at least one of the fifth surface to the second surface and the sixth surface to the third surface.

3. The apparatus of claim 1, wherein the second surface and the third surface are part of a stair-step shape on the first fin portion, wherein the stair-step shape comprises additional surfaces at different distances from the first surface, and wherein the second fin portion comprises a corresponding stair-step shape comprising at least the fifth surface and the sixth surface and additional surfaces at different distances from the fourth surface.

4. The apparatus of claim 1, wherein the first fin portion comprises copper and the second fin portion comprises aluminum.

5. The apparatus of claim 1, wherein the first fin portion comprises an alloy material comprising copper and aluminum and the second fin portion comprises one of copper and aluminum.

6. The apparatus of claim 1, wherein at least some of the first plurality of parallel fins have a thickness of less than 0.2 mm.

7. The apparatus of claim 1, wherein at least some of the first plurality of parallel fins have a thickness of less than 0.1 mm.

8. The apparatus of claim 1, wherein at least one fin of the first plurality of fins has a thickness greater than at least one fin of the second plurality of fins.

9. The apparatus of claim 1, wherein each of the first plurality of parallel fins is in contact with the first surface, the second surface, and the third surface and wherein each of the second plurality of parallel fins is in contact with the fourth surface, the fifth surface, and the sixth surface.

10. An information handling system, comprising:
    a chassis;
    a processor located in the chassis; and
    a heatsink thermally coupled to the processor, wherein the heatsink comprises:
      a first fin portion comprising a first surface, a second surface and a third surface, wherein the second surface and the third surface are on a side of the first fin portion opposite the first surface, and wherein the second surface and the third surface are located different distances from the first surface; and
      a second fin portion comprising a fourth surface, a fifth surface, and a sixth surface, the fourth surface located at one end of the second fin portion and the fifth surface and the sixth surface located at an opposite end of the second fin portion from the fourth surface, wherein the fifth surface and the sixth surface are located different distances from the fourth surface, wherein the first fin portion and the second fin portion are coupled together by coupling of the fifth surface with the second surface and by coupling of the sixth surface with the third surface, wherein the first fin portion comprises a first material and the second fin portion comprises a different second material, and wherein the first fin portion comprises a first plurality of parallel fins coupled to the first surface, the second surface, and the third surface and the second fin portion comprises a second plurality of parallel fins coupled to the fourth surface, the fifth surface, and the sixth surface.

11. The information handling system of claim 10, wherein the first fin portion and the second fin portion are coupled together by soldering of at least one of the fifth surface to the second surface and the sixth surface to the third surface.

12. The information handling system of claim 10, wherein the second surface and the third surface are part of a stair-step shape on the first fin portion, wherein the stair-step shape comprises additional surfaces at different distances from the first surface, and wherein the second fin portion comprises a corresponding stair-step shape comprising at least the fifth surface and the sixth surface and additional surfaces at different distances from the fourth surface.

13. The information handling system of claim 10, wherein the first fin portion comprises copper and the second fin portion comprises aluminum.

14. The information handling system of claim 10, wherein the first fin portion comprises an alloy material comprising copper and aluminum and the second fin portion comprises one of copper and aluminum.

15. The information handling system of claim 10, wherein at least some of the first plurality of parallel fins have a thickness of less than 0.2 mm.

16. The information handling system of claim 10, wherein at least some of the first plurality of parallel fins have a thickness of less than 0.1 mm.

17. A method, comprising:

coupling a first fin portion to a second fin portion to form a heatsink, wherein:
  a first fin portion comprises a first surface, a second surface and a third surface, wherein the second surface and the third surface are on a side of the first fin portion opposite the first surface, and wherein the second surface and the third surface are located different distances from the first surface;
  a second fin portion comprises a fourth surface, a fifth surface, and a sixth surface, the fourth surface located at one end of the second fin portion and the fifth surface and the sixth surface located at an opposite end of the second fin portion from the fourth surface, wherein the fifth surface and the sixth surface are located different distances from the fourth surface;
  the first fin portion and the second fin portion are coupled together by coupling of the fifth surface with the second surface and by coupling of the sixth surface with the third surface,
  the first fin portion comprises a first material and the second fin portion comprises a different second material, and
  the first fin portion comprises a first plurality of parallel fins coupled to the first surface, the second surface, and the third surface and the second fin portion comprises a second plurality of parallel fins coupled to the fourth surface, the fifth surface, and the sixth surface.

18. The method of claim 17, further comprising thermally coupling the heatsink to a processor of an information handling system.

19. The method of claim 17, wherein the step of coupling the first fin portion to the second fin portion comprises soldering the first fin portion to the second fin portion.

20. The method of claim 19, wherein the step of soldering the first fin portion to the second fin portion comprises soldering a first fin portion comprising copper to a second fin portion comprising aluminum.

* * * * *